United States Patent
Yamashita et al.

(10) Patent No.: US 12,046,273 B2
(45) Date of Patent: Jul. 23, 2024

(54) APPARATUSES AND METHODS FOR INPUT BUFFER POWER SAVINGS

(71) Applicant: MICRON TECHNOLOGY, INC., Boise, ID (US)

(72) Inventors: Akira Yamashita, Sagamihara (JP); Kenji Asaki, Sagamihara (JP)

(73) Assignee: MICRON TECHNOLOGY, INC., Boise, ID (US)

( * ) Notice: Subject to any disclaimer, the term of this patent is extended or adjusted under 35 U.S.C. 154(b) by 10 days.

(21) Appl. No.: 17/936,166

(22) Filed: Sep. 28, 2022

(65) Prior Publication Data
US 2023/0019887 A1 Jan. 19, 2023

Related U.S. Application Data

(63) Continuation of application No. 17/125,095, filed on Dec. 17, 2020, now Pat. No. 11,475,939.

(51) Int. Cl.
| | |
|---|---|
| *G11C 11/4093* | (2006.01) |
| *G01R 31/26* | (2020.01) |
| *G11C 7/10* | (2006.01) |
| *G11C 7/22* | (2006.01) |
| *G11C 11/4076* | (2006.01) |

(52) U.S. Cl.
CPC ...... *G11C 11/4093* (2013.01); *G11C 11/4076* (2013.01); *G11C 7/1078* (2013.01); *G11C 7/1084* (2013.01); *G11C 7/1087* (2013.01); *G11C 7/22* (2013.01); *G11C 7/222* (2013.01); *G11C 2207/2254* (2013.01)

(58) Field of Classification Search
CPC . G11C 11/4093; G11C 7/1078; G11C 7/1087; G11C 7/222
USPC .......................................................... 365/149
See application file for complete search history.

(56) References Cited

U.S. PATENT DOCUMENTS

| | | | | |
|---|---|---|---|---|
| 5,861,893 A | * | 1/1999 | Sturgess | ................. G09G 5/363 345/522 |
| 2002/0024882 A1 | * | 2/2002 | Ikeda | .................. G11C 11/4076 365/189.05 |
| 2003/0043646 A1 | * | 3/2003 | Setogawa | ............ G11C 7/1078 365/193 |

(Continued)

FOREIGN PATENT DOCUMENTS

| | | |
|---|---|---|
| CN | 105978540 A | 9/2016 |
| WO | 2014112509 A1 | 7/2014 |
| WO | 2022/132536 A1 | 6/2022 |

OTHER PUBLICATIONS

International Search Report/Written Opinion dated Apr. 5, 2022 for PCT Application No. PCT/US2021/062457.

*Primary Examiner* — Ly D Pham
(74) *Attorney, Agent, or Firm* — Dorsey & Whitney LLP

(57) ABSTRACT

Apparatuses and methods for saving power at an input buffer are described. An example apparatus includes an input buffer comprising an amplifier coupled to a pair of serially coupled inverters, and a de-emphasis circuit coupled to the input buffer in parallel with one of the pair of serially-coupled inverters. The de-emphasis circuit comprising a plurality of transistors coupled in parallel to a resistance. The example apparatus further includes an input buffer control circuit configured to selectively enable one of the plurality of transistors to adjust a gain across the one of the pair of inverters based on a latency setting.

13 Claims, 6 Drawing Sheets

(56) References Cited

U.S. PATENT DOCUMENTS

| | | |
|---|---|---|
| 2008/0056033 A1 | 3/2008 | Jeong |
| 2010/0329041 A1 | 12/2010 | Sohn et al. |
| 2017/0338780 A1 | 11/2017 | Bajwa et al. |
| 2018/0053538 A1* | 2/2018 | Miyano ................. G11C 7/1066 |
| 2020/0027494 A1 | 1/2020 | Yamashita et al. |
| 2020/0228137 A1* | 7/2020 | Chinya ................. G06F 17/153 |
| 2021/0021448 A1 | 1/2021 | Beukema |
| 2022/0199146 A1 | 6/2022 | Yamashita et al. |

* cited by examiner

APPARATUSES AND METHODS FOR INPUT BUFFER POWER SAVINGS

CROSS REFERENCE TO RELATED APPLICATION(S)

This application is a continuation application of U.S. patent application Ser. No. 17/125,095 filed Dec. 17, 2020 and issued as U.S. Pat. No. 11,475,939 on Oct. 18, 2022. This application is incorporated by reference herein in its entirety and for all purposes.

BACKGROUND

Due to the high-speed nature of communication between semiconductor devices, many semiconductor devices employ pre-emphasis circuits on a transmitter side to pre-distort a signal for transmission over a channel based on anticipated effects of the channel and/or de-emphasis circuits on the receiver side to compensate for anticipated effects of the channel. De-emphasis circuits may reduce a signal amplitude to a normal level before the signal is decoded via circuitry on a semiconductor device. In some conventional implementations, the de-emphasis circuitry may be designed and optimized for a specific frequency application, making it difficult or impossible to re-purpose the de-emphasis circuit for other frequency applications. Thus, it may be desirable to have an ability to control or configure de-emphasis circuitry among more than one frequency application.

DETAILED DESCRIPTION

Figure 1:
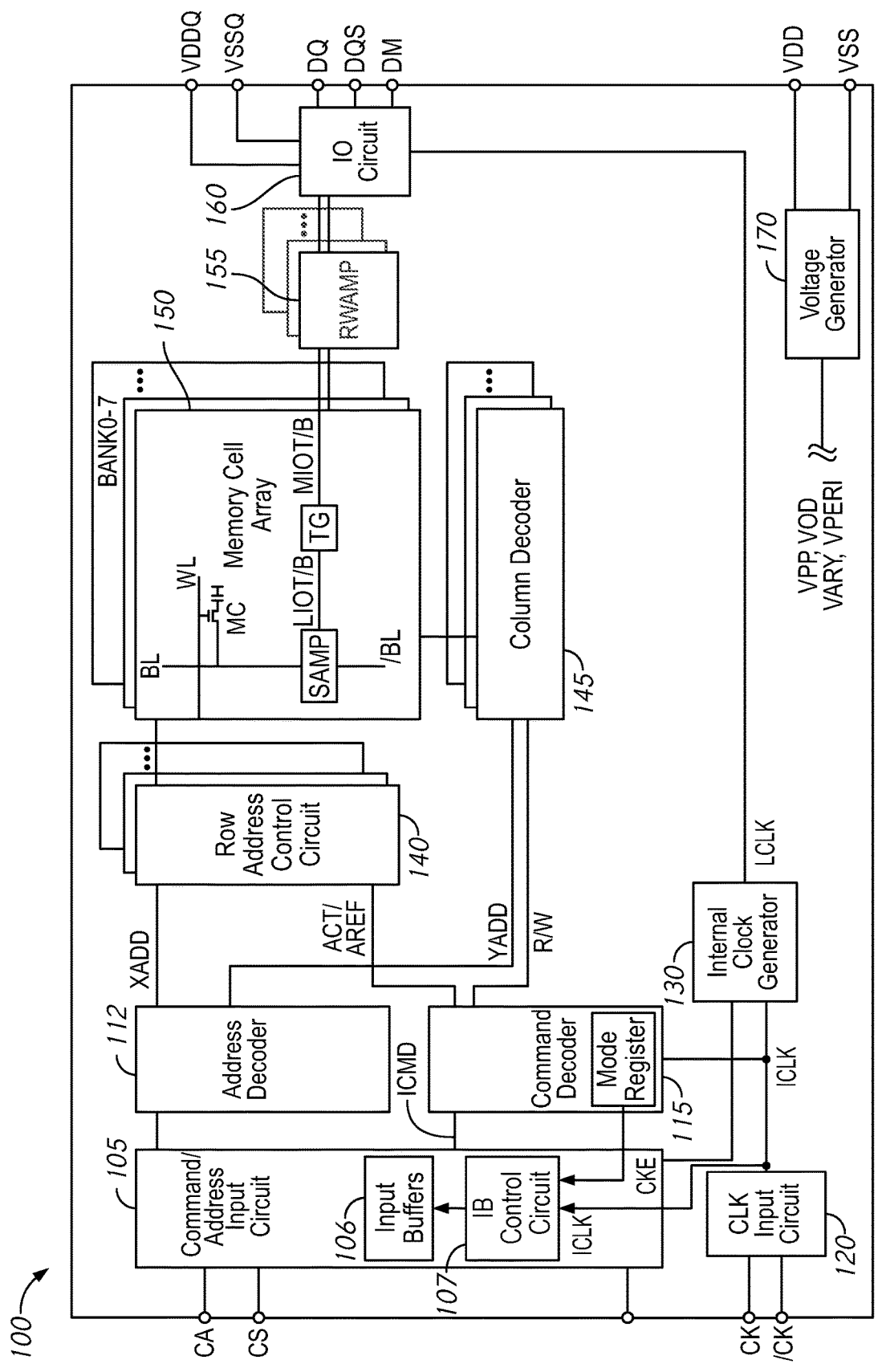
FIG. 1 is a block diagram of an apparatus according to an embodiment of the disclosure.

This disclosure describes examples of power savings on a configurable input buffer with a configurable de-emphasis circuit that is capable of controlling the de-emphasis strength. An input buffer with a configurable de-emphasis circuit may include an amplifier connected in series with an inverter. The de-emphasis circuit may be coupled in parallel with the inverter. The amplifier may be connected to a channel and may be configured to receive signals containing encoded with information, such as data, commands, addresses, other control signals, etc. In some examples, the amplifier may be a single-ended amplifier configured to compare the amplitude of the received signal with a reference signal in order to provide an amplified output signal to the configurable de-emphasis circuit and the inverter. In other examples, the amplifier may be a differential amplifier configured to compare the amplitude of two differential signal in order to provide an amplified output signal to the configurable de-emphasis circuit and the inverter.

In some examples, the gain of the amplifier may be controlled via current-limiting enable signals provided to the amplifier. The amount of gain realized from the output of the amplifier may also be controlled by the configurable de-emphasis circuit. In some examples, the configurable de-emphasis circuit may adjust a resistance across an inverter coupled to an output node of the amplifier in order to adjust a gain across the inverter. The de-emphasis circuit may include a ladder circuit of two or more steps passgate circuits coupled in parallel with the inverter from an output node of the amplifier to an output node of the inverter. The transistors on one or more steps of the ladder circuit may be selectively enabled to act as additional pass gates to adjust the resistance across the inverter. The lower the resistance across the de-emphasis circuit (e.g., more passgates of the ladder circuit enabled), the lower the gain across the inverter. Conversely, the higher the resistance across the de-emphasis circuit, (e.g., fewer passgates of the ladder circuit enabled), the higher the gain across the inverter. By increasing a gain across the inverter at an output of the amplifier, an amount of current consumed by the input buffer may be reduced. The input buffer may select the gain based on a data frequency. For higher frequencies, the gain provided by the de-emphasis circuit may in reduced. For lower frequencies, the gain provided by the de-emphasis circuit may be increased.

Certain details are set forth below to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the examples of the disclosure. Additionally, terms such as "couples" and "coupled" mean that two components may be directly or indirectly electrically coupled. Indirectly coupled may imply that two components are coupled through one or more intermediate components.

FIG. 1 is a block diagram of an apparatus according to an embodiment of the disclosure. The apparatus may include a semiconductor device 100, and will be referred as such. In some embodiments, the semiconductor device 100 may include, without limitation, a DRAM device, such as a double data rate (DDR) memory or a low power DDR (LPDDR) memory integrated into a single semiconductor chip, for example. The semiconductor device 100 includes a memory array 150. The memory array 150 includes a plurality of banks, each bank including a plurality of word lines WL, a plurality of bit lines BL and /BL, and a plurality of memory cells MC arranged at intersections of the plurality of word lines WL and the plurality of bit lines BL. The memory cells MC are volatile memory cells, requiring periodic refreshing in order to maintain the data stored in the memory array.

The selection of the word line WL is performed by a row address control circuit 140 and the selection of the bit line BL is performed by a column decoder 145. Sense amplifiers (SAMP) are located for their corresponding bit lines BL and /BL coupled to at least one respective local I/O line pair (LIOT/B), which is in turn coupled to at least one respective main I/O line pair (MIOT/B), via transfer gates (TG), which function as switches.

The memory array 150 may be divided into memory banks BANK0-7, with each memory bank having a regular array and a redundant array. The regular array includes memory cells that are typically used to store data with the memory cells corresponding to respective memory addresses. The redundant array includes memory cells that may be used to "repair" defective memory cells of the regular array. The memory cells may be configured as redundant rows of memory and redundant columns of memory. The redundant rows of memory may be used to repair rows of memory of the regular array, and the redundant columns of memory may be used to repair columns of memory of the regular array. The redundant memory are used to repair defective memory cells of the regular array by having the memory addresses corresponding to the defect memory cells mapped to memory cells of the redundant array. As a result, when the memory address for the defective memory location is provided to the semiconductor device 100, the memory location in the redundant array to which the memory address is mapped is accessed instead of the defective memory location in the regular array corresponding to that memory address.

The semiconductor device 100 may employ a plurality of external terminals, which include command/address terminals CA that are coupled to a command and address bus to receive commands and addresses. The plurality of external terminals further includes clock terminals CK and CK/ to receive clock signals, data terminals DQ and data mask terminals DM, and power supply terminals VDD, VSS, VDDQ, and VSSQ.

The command/address terminals CA may be supplied with memory addresses, for example, from a memory controller. The memory addresses supplied to the command/address terminals CA are transferred, via a command/address input circuit 105, to an address decoder 112. The address decoder 112 receives the memory addresses and supplies decoded row addresses XADD to the row address control circuit 140, and supplies decoded column addresses YADD to the column decoder 145.

The command/address terminals CA may further be supplied with commands from, for example, a memory controller. The commands may be provided as internal command signals ICMD to a command decoder 115 via the command/address input circuit 105. The command decoder 115 includes circuits to decode the internal commands ICMD to generate internal commands and signals for performing operations. For example, the command decoder 115 may provide activation commands ACT and refresh commands AREF to the row address control circuit 140 to select a word line and may provide read/write commands R/W to the column decoder 145 to select a bit line. Refresh commands AREF may be provided by the command decoder 115 to the row control circuit 140 when a refresh operation is to be performed. The refresh command AREF may represent auto refresh commands that result from the semiconductor device 100 receiving a refresh command, and may also represent self-refresh commands, which are generated internally when the semiconductor device 100 is set in a self-refresh mode.

When a read command is received and a memory address is timely supplied with the read command, read data is read from a memory cell in the memory array 150 designated by the memory address. The read data is output to outside from the data terminals DQ via read/write amplifiers 155 and the input/output circuit 160. When a write command is received and a memory address is timely supplied with the write command, write data and a data mask (when applicable) are supplied to the data terminals DQ and DM, and the write data is written to a memory cell in the memory array 150 designated by the memory address. The write data is received by data receivers in the input/output circuit 160, and supplied via the input/output circuit 160 and the read/write amplifiers 155 to the memory array 150.

During the access operations for read and write commands, the row address control circuit 140 may include circuits for determining whether a memory address has been mapped to memory locations in the redundant array, for example, when a memory address corresponding to a defective memory location in the regular array has been mapped to memory locations of the redundant array (e.g., a redundant row of memory). The memory addresses that have been remapped are stored, and memory addresses associated with access operations are compared with the stored memory addresses. The memory addresses that have been mapped to redundant memory may be stored in nonvolatile storage. An example of a nonvolatile storage are fuse circuits (as well as antifuse circuits) that are programmed with the memory addresses to be stored. When a memory address associated with an access operation matches a stored memory address, memory locations in the redundant array are accessed instead of the memory locations in the regular array.

As previously described, the volatile memory cells are periodically refreshed in order to maintain the data stored by the memory array. The memory cells are typically refreshed as rows of memory cells. The row address control circuit 140 may include a refresh control circuit that is used during refresh operations. Refresh operations are performed when active refresh commands AREF are provided to the row address control circuit 140. Each refresh command AREF results in memory locations associated with a refresh address to be refreshed. In some embodiments of the disclosure, the refresh address may be generated internally in the semiconductor device 100. Similar circuits and operation may be included in the column decoder 145 in some embodiments of the disclosure.

Turning to an explanation of the external terminals included in the semiconductor device 100, the clock terminals CK and /CK are supplied with complementary external clock signals. The external clock signals may be supplied to a clock input circuit 120. The clock input circuit 120 may generate internal clock signals ICLK. The internal clock signals ICLK are supplied to internal clock generator circuit 130 and to the command decoder 115. When enabled by clock enable CKE from the command/address input circuit 105, circuits of the internal clock generator circuit 130 provide various internal clock signals LCLK based on the internal clock signals ICLK. The internal clock signals LCLK may be used for timing the operation of various internal circuits. For example, the LCLK signals may be provided to the input/output circuit 160 for timing the operation of the input/output circuit 160 to provide and receive data on the data terminals DQ.

The power supply terminals VDD and VSS are supplied with power supply potentials. These power supply potentials are supplied to an internal voltage generator circuit 170. The internal voltage generator circuit 170 generates various internal potentials VPP, VOD, VARY, VPERI, and the like based on the power supply potentials provided to the power supply terminals VDD and VSS. The internal potential VPP is mainly used in the row address control circuit 140, the internal potentials VOD and VARY are mainly used in the sense amplifiers SAMP included in the memory array 150, and the internal potential VPERI is used in many other peripheral circuit blocks.

The power supply terminals VDDQ and VSSQ are also supplied with power supply potentials. The power supply potentials are supplied to the input/output circuit 160. The power supply potentials provided to the power supply terminals VDDQ and VSSQ may be the same potentials as the power supply potentials provided to the power supply terminals VDD and VSS in some embodiments of the disclosure. Dedicated power supply potentials are provided to the power supply terminals VDDQ and VSSQ so that power supply noise generated by the input/output circuit 160 does not propagate to the other circuit blocks.

In some examples, the command/address input circuit 105 may include input buffers 106 coupled to input buffer control circuit 107. The input buffers 106 may be configurable input buffers with configurable de-emphasis circuitry that is capable of controlling the de-emphasis strength. The input buffers 106 may each include an amplifier connected in series with a de-emphasis circuit. The amplifier may be connected to a respective one of the CA or CS terminals and may be configured to receive signals containing encoded with information, such as data, commands, addresses, other control signals, etc. In some examples, each amplifier may be a single-ended amplifier configured to compare the amplitude of the received signal with a reference signal in order to provide an amplified output signal to a node that is coupled to the configurable de-emphasis circuit in parallel with an inverter. In other examples, each amplifier may be a differential amplifier configured to compare the amplitude of two differential signal in order to provide an amplified output signal to the configurable de-emphasis circuit and the inverter. In some examples, the gain of the amplifier may be controlled via current-limiting enable signals provided to the amplifier from the input buffer control circuit 107. The amount of gain realized from the output of the amplifier may also be controlled by the configurable de-emphasis circuit. In some examples, the configurable de-emphasis circuit may adjust a resistance across an inverter coupled to an output node of the amplifier in order to adjust a gain across the inverter. The de-emphasis circuit may include a ladder circuit of two or more steps passgate circuits coupled in parallel with the inverter from an output node of the amplifier to an output node of the inverter. The transistors on one or more steps of the ladder circuit may be selectively enabled to act as additional pass gates to adjust the resistance across the inverter. The lower the resistance across the de-emphasis circuit (e.g., more passgates of the ladder circuit enabled), the lower the gain across the inverter. Conversely, the higher the resistance across the de-emphasis circuit, (e.g., fewer passgates of the ladder circuit enabled), the higher the gain across the inverter.

The input buffer control circuit 107 may be configured to control the enable signals provided to the amplifier, as well as control which passgates of the de-emphasis circuit are enabled based on mode register settings from the 115. The mode register settings may define various latencies (e.g., read latency, write latency, additive latency, or any combination thereof) and whether the CK and /CK signals are single-ended or differential clock signals. In some examples, a latency between receiving a read command and providing output data may be defined by a read latency and an additive latency. In some examples, a latency between receiving a write command and receiving write data may be defined by a write latency and an additive latency. These signals may help define the speed at which the input buffers 106 should be capable of operating. By increasing a gain across the inverter at an output of the amplifier, an amount of current consumed by the input buffer may be reduced. The input buffer may select the gain based on a data frequency. For higher frequencies, the gain provided by the de-emphasis circuit may in reduced. For lower frequencies, the gain provided by the de-emphasis circuit may be increased.

Figure 2:
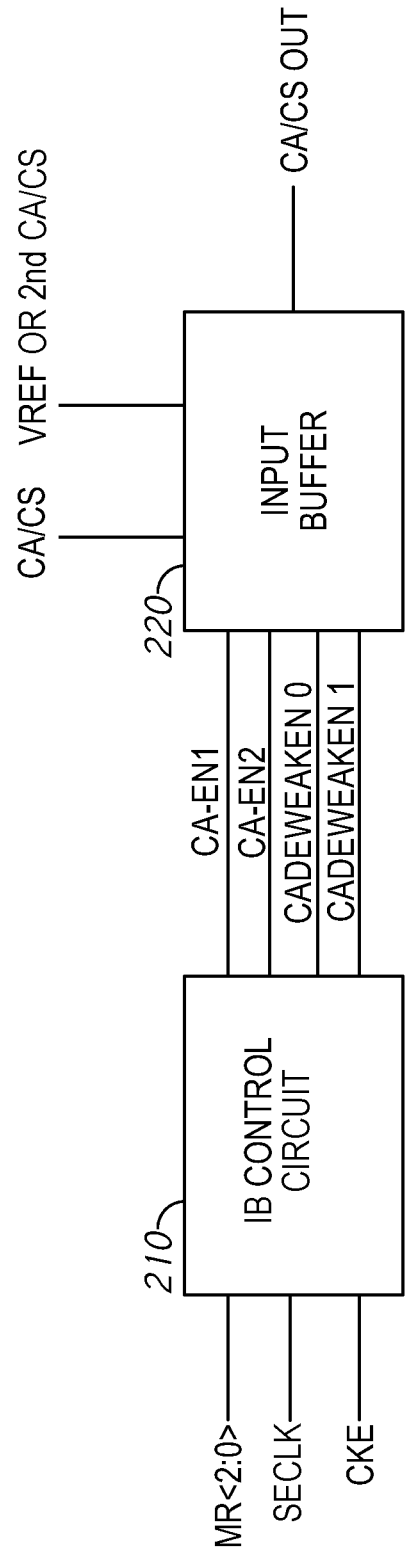
FIG. 2 is an exemplary block diagram of part of a command/address input circuit according to an embodiment of the disclosure.

FIG. 2 is an exemplary block diagram of part of a command/address input circuit 200 according to an embodiment of the disclosure. The command/address input circuit 105 of FIG. 1 may implement the command/address input circuit 200, in some embodiments. The command/address input circuit 200 may include an input buffer control circuit 210 coupled to an input buffer 220.

The input buffer control circuit 210 may be configured to receive mode register settings, MR<2:0>, a single-ended clock enable signal SECLK, and a clock enable signal CKE. In response to the MR<2:0> settings, the CLK signals, and the CKE signal, the input buffer control circuit 210 may provide first and second buffer enable signals CA-EN1 and CA-EN2 and first and second buffer weaken signals CADEWEAKEN0 and CADEWEAKEN1. The MR<2:0> signals may define a latency setting (e.g., read latency, write latency, additive latency, or any combination thereof).

The input buffer 220 may be configured to receive the CA-EN1/2 and CADEWEAKEN0/1 signals from the input buffer control circuit 210, along with signals from the CA/CS terminal and a reference voltage VREF. The input buffer 220 may be configured to provide signals received via the CA/CS terminal as CA/CS OUT signals based on the received input signals.

In operation, the input buffer 220 may include configurable de-emphasis circuitry that is capable of controlling the de-emphasis strength The input buffer control circuit 210 may control the de-emphasis circuitry of the input buffer 220 based on the mode register settings MR<2:0>, which indicate a clock speed at which the input buffer 220 should be expected to support.

Specifically, the input buffer control circuit 210 may be configured to set the CA-EN1 and CA-EN2 signals based on the MR<2:1> settings, the SECLK setting, and the CKE signal. When CKE is enabled and when both of the MR<2:1> settings are set or the SECLK signal is set to indicate a single-ended clock, the CA-EN2 signal may be set high. Otherwise, it may be set low. When the CKE signal is set, the CA-EN1 signal may be set high. Otherwise it may be set low.

The input buffer control circuit 210 may be configured to set the CADEWEAKEN0/1 signals based on the MR<2:0> settings, the SECLK setting, and the CKE signal. The input buffer control circuit 210 may be configured to set the CADEWEAKEN1 signal high when the SECLK signal is set and only one of the MR<1:0> signals are set. Otherwise, it may be set low. The input buffer control circuit 210 may be configured to set the CADEWEAKEN0 signal high when the CA-EN2 signal is set low and the CADEWEAKEN1 signal is set high. Otherwise, it may be set low. SECLK signal is set and only one of the MR<1:0> signals are set.

The input buffer 220 may include an amplifier connected in series with a de-emphasis circuit. The amplifier may be connected to a respective CA/CS terminal and may be configured to receive signals containing encoded with information, such as data, commands, addresses, other control signals, etc. In some examples, the amplifier may be a single-ended amplifier configured to compare the amplitude of the received signal with the VREF signal in order to provide an amplified output signal to a node that is coupled to the configurable de-emphasis circuit in parallel with an inverter. In other examples, the input buffer 220 may be connected to a second CA/CS terminal (e.g., rather than receiving the VREF signal), and the amplifier may be a differential amplifier configured to compare the amplitude of the two differential signals from the two CA/CS terminals in order to provide an amplified output signal to the configurable de-emphasis circuit and the inverter. In some examples, the gain of the amplifier may be controlled via current-limiting CA-EN1 and CA-EN2 provided to the amplifier from the input buffer 220. For example, when both of the CA-EN1 and CA-EN2 signals are set, the amplifier may operate at full strength. When the CA-EN2 signal is cleared, the amplifier may operate at a lower capacity. In some examples, the lower capacity may be less than 50%, such as 33%. When both of the CA-EN1 and CA-EN2 signals are set low, the amplifier may be disabled.

The amount of gain realized from the output of the input buffer control circuit 210 may also be controlled by the configurable de-emphasis circuit. In some examples, the configurable de-emphasis circuit may adjust a resistance across an inverter coupled to an output node of the amplifier in order to adjust a gain across the inverter. The de-emphasis circuit may include a ladder circuit of two or more steps passgate circuits coupled in parallel with the inverter from an output node of the amplifier to an output node of the inverter. The transistors on one or more steps of the ladder circuit may be selectively enabled via the CADEWEAKEN0/1 signals to act as additional pass gates to adjust the resistance across the inverter. The lower the resistance across the de-emphasis circuit (e.g., more pass-gates of the ladder circuit enabled), the lower the gain across the inverter. Conversely, the higher the resistance across the de-emphasis circuit, (e.g., fewer passgates of the ladder circuit enabled), the higher the gain across the inverter. Thus, when both of the CADEWEAKEN0/1 signals are set low, the de-emphasis circuit may achieve a lowest gain (e.g., better for higher speed applications). When both of the CADEWEAKEN0/1 signals are set low, the de-emphasis circuit may achieve a highest gain (e.g., better for lower speed applications). When one of the CADEWEAKEN0/1 signals is set high and the other set low, the de-emphasis circuit may achieve an intermediate gain (e.g., tuned for intermediate speed applications).

Figure 3:
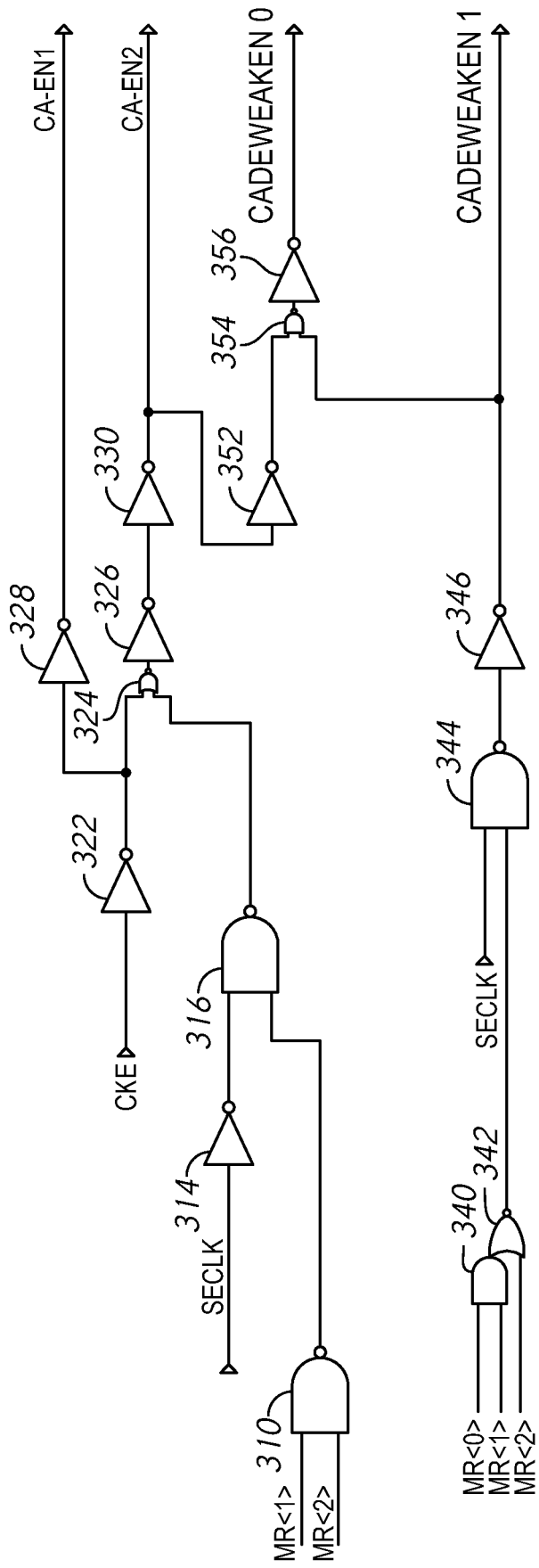
FIG. 3 is an exemplary schematic diagram of an input buffer control circuit according to an embodiment of the disclosure.

FIG. 3 is an exemplary schematic diagram of an input buffer control circuit 300 according to an embodiment of the disclosure. The input buffer control circuit 107 of FIG. 1 and/or the input buffer control circuit 210 of FIG. 2 may implement the input buffer control circuit 300, in some embodiments.

The input buffer control circuit 300 may be configured to receive the MR<2:0> settings, the CKE, and the SECLK signal and may include several logic gates that collectively control the CA-EN1, CA_EN2, and CADEWEAKEN0/1 signals. An inverter 322 and an inverter 328 may control the CA-EN1 signal based on a value of the CKE signal. Generally, the CA-EN1 signal may track a value of the CKE signal via the inverter 322 and the inverter 328. The CA-EN1, CA-EN2, and CADEWEAKEN0/1 signals may be provided to an input buffer (e.g., one of the input buffers 106 of FIG. 1 and/or the input buffer 220 of FIG. 2) to control a gain and current draw.

A NAND gate 310, an inverter 314, a NAND gate 316, the inverter 322, a NAND gate 324, an inverter 326, and an inverter 330 may control the CA-EN2 signal based on the SECLK and MR<2:1> settings. The NAND gate 310 may apply NAND logic to the MR<2:1> settings to provide an output signal. Thus, if both of the MR<2:1> settings are high, then the output of the NAND gate 310 is low, indicating a lower latency (e.g., read latency, write latency, additive latency, or any combination thereof). The NAND gate 316 may apply NAND logic to an output of the NAND gate 310 and the SECLK signal inverted via a inverter 314 (e.g., differential clock signal). Thus if the output of the NAND gate 310 is high (e.g., indicating a higher latency (e.g., read latency, write latency, additive latency, or any combination thereof)) and the SECLK indicates a differential clock signal, then the output of the NAND gate 316 is low. Otherwise it is set high. The inverter 326 may apply NAND logic to the inverted CKE signal (e.g., via the inverter 322) and the output of the NAND gate 316. When the CKE signal is set low and the output of the NAND gate 316 is high (e.g., single-ended clock signal or low latency operation), then the output of the NAND gate 324 is set low. Otherwise, it is set high. An inverter 326 coupled in series with an inverter 330 may provide the output of the NAND gate 316 as the CA-EN2 signal.

An AND gate 340, a NOR gate 342, a NAND gate 344, and an inverter 346 may control the CADEWEAKEN1 signal based on the MR<2:0> settings and the SECLK signal. The AND gate 340 and the NOR gate 342 may be set low when more than one of the MR<2:0> settings are set high (e.g., indicating at least an intermediate latency). Otherwise, the output of the AND gate 340 and the NOR gate 342 may be set high (e.g., indicating a higher latency). The NAND gate 344 may apply NAND logic to an output of the NOR gate 342 and the SECLK signal. Thus if the output of the NAND gate 310 is high (e.g., indicating a higher latency) and the SECLK indicates a single-ended clock signal, then the output of the NAND gate 344 is low Otherwise, it may be set high. The output of the NAND gate 344 may be inverted via an inverter 346 to provide the CADEWEAKEN1 signal. In some examples, the latency may include a read latency. In other examples, the latency may include a write latency, an additive latency, or any combination the read latency, the write latency, or the additive latency.

The CADEWEAKEN0 signal may be set based on a combination of the CA-EN2 signal and the CADEWEAKEN1 signal via an inverter 352, a NAND gate 354, and an inverter 356. The NAND gate 354 may apply NAND logic to an inverted CA-EN2 signal (via the inverter 352) and the CADEWEAKEN1 signal. Thus, if the CADEWEAKEN1 is set high and the CA-EN2 signal is set low, then the output of the NAND gate 354 is set low. Otherwise, it is set high. The inverter 356 may invert the output of the NAND gate 354 to provide the CADEWEAKEN0 signal.

Figure 4:
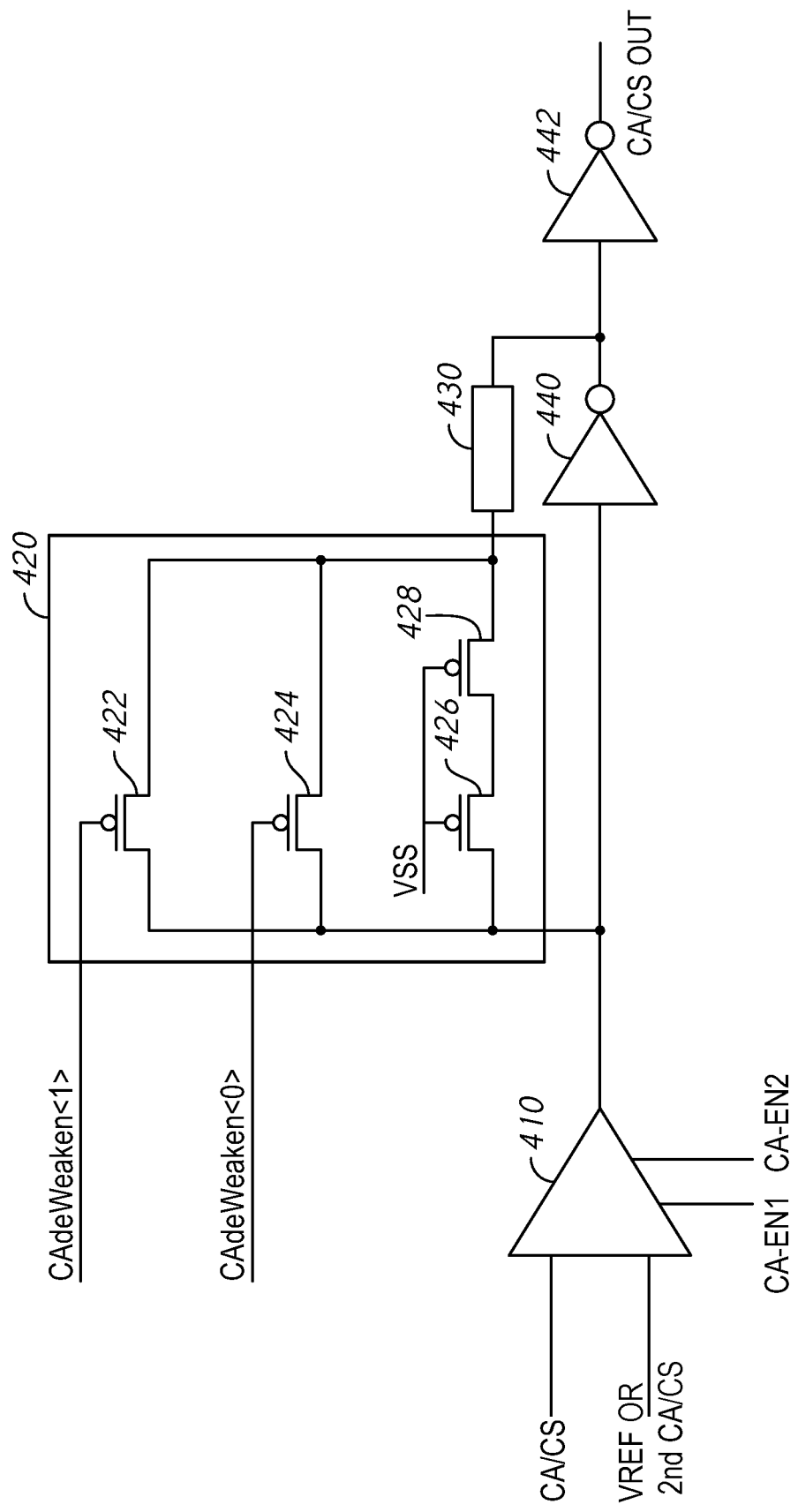
FIG. 4 is an exemplary schematic diagram of an input buffer according to an embodiment of the disclosure.

FIG. 4 is an exemplary schematic diagram of an input buffer 400 according to an embodiment of the disclosure. Any one of the input buffers 106 of FIG. 1 and/or the input buffer 220 of FIG. 2 may implement the input buffer 400, in some embodiments.

The input buffer 400 may include an amplifier 410, a de-emphasis circuit 420 coupled in series with a resistor 430, an inverter 440, and an inverter 442. The amplifier 410 may be configured to receive the CA-EN1/2 signals, along with signals from the CA/CS terminal and a reference voltage VREF. The input buffer 220 may be configured to provide signals received via the CA/CS terminal to the de-emphasis circuit 420 and the inverter 440 based on the VREF signal and the CA-EN1/2 signals. In other examples, the amplifier 410 may be connected to a second CA/CS terminal (e.g., rather than receiving the VREF signal), and the amplifier 410 may be a differential amplifier configured to compare the amplitude of the two differential signals from the two CA/CS terminals provide an output signal to the de-emphasis circuit 420 and the resistor 430. When both of the CA-EN1 and CA-EN2 signals are set, the amplifier 410 is enabled at full power. When neither of the CA-EN1 and CA-EN2 signals are set, the amplifier 410 may be disabled. When only the CA-EN1 signal is set, the amplifier 410 may operate at a lower power. In some examples, the lower power is less than 50% of full power. In some examples, the lower power is 33% of the full power.

The de-emphasis circuit 420 may be coupled in series with the resistor 430, and include a transistor 422, a transistor 424, and serially-coupled transistor 426 and transistor 428. The serially-coupled transistor 426 and transistor 428 may be enabled via the supply voltage VSS. However, the transistor 422 and the transistor 424 may be selectively enabled via the CADEWEAKEN0/1 signals, respectively, to change a resistance across the de-emphasis circuit 420, which may affect a gain across the inverter 440. For example, by enabling one or both of the transistor 422 and the transistor 424, a resistance of the de-emphasis circuit 420 in series with the resistor 430 may be reduced, which may decrease a gain across the inverter 440. A gain across the inverter 440 may be at its lowest when both of the transistor 422 and the transistor 424 are enabled and may be at its highest when neither of the transistor 422 and the transistor 424 are enabled. Implementing the de-emphasis circuit 420 to be configurable and allow a gain across the inverter 440 to be adjusted may facilitate operation across a wider array of clock frequencies and at reduced power consumption. In some examples, the transistor 422 and the transistor 424 may have a similar channel width. In other examples, the transistor 422 and the transistor 424 may have different channel widths. In some examples, the channel widths of the transistor 422 and the transistor 424 may be greater than the channel widths of the transistor 426 and the transistor 428. In operation, the input buffer 220 may include configurable de-emphasis circuitry that is capable of controlling the de-emphasis strength The input buffer control circuit 210 may control the de-emphasis circuitry of the input buffer 220 based on the mode register settings MR<2:0>, which indicate a clock speed at which the input buffer 220 should be expected to support.

The inverter 442 may invert an output of the inverter 440 and the resistor 430 to provide the CA/CS OUT signal.

Figure 5:
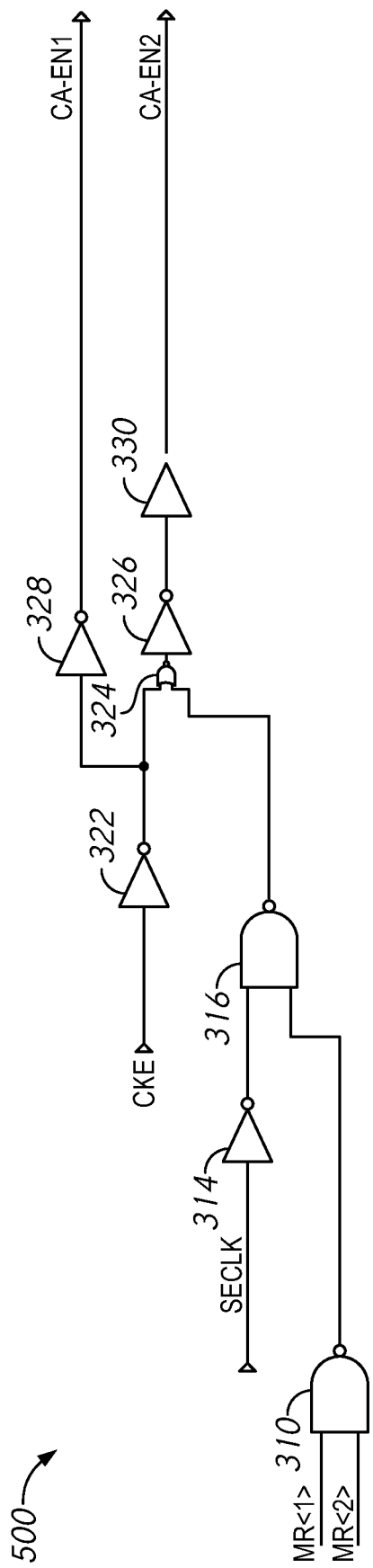
FIG. 5 is an exemplary schematic diagram of an input buffer control circuit according to an embodiment of the disclosure.
Figure 6:
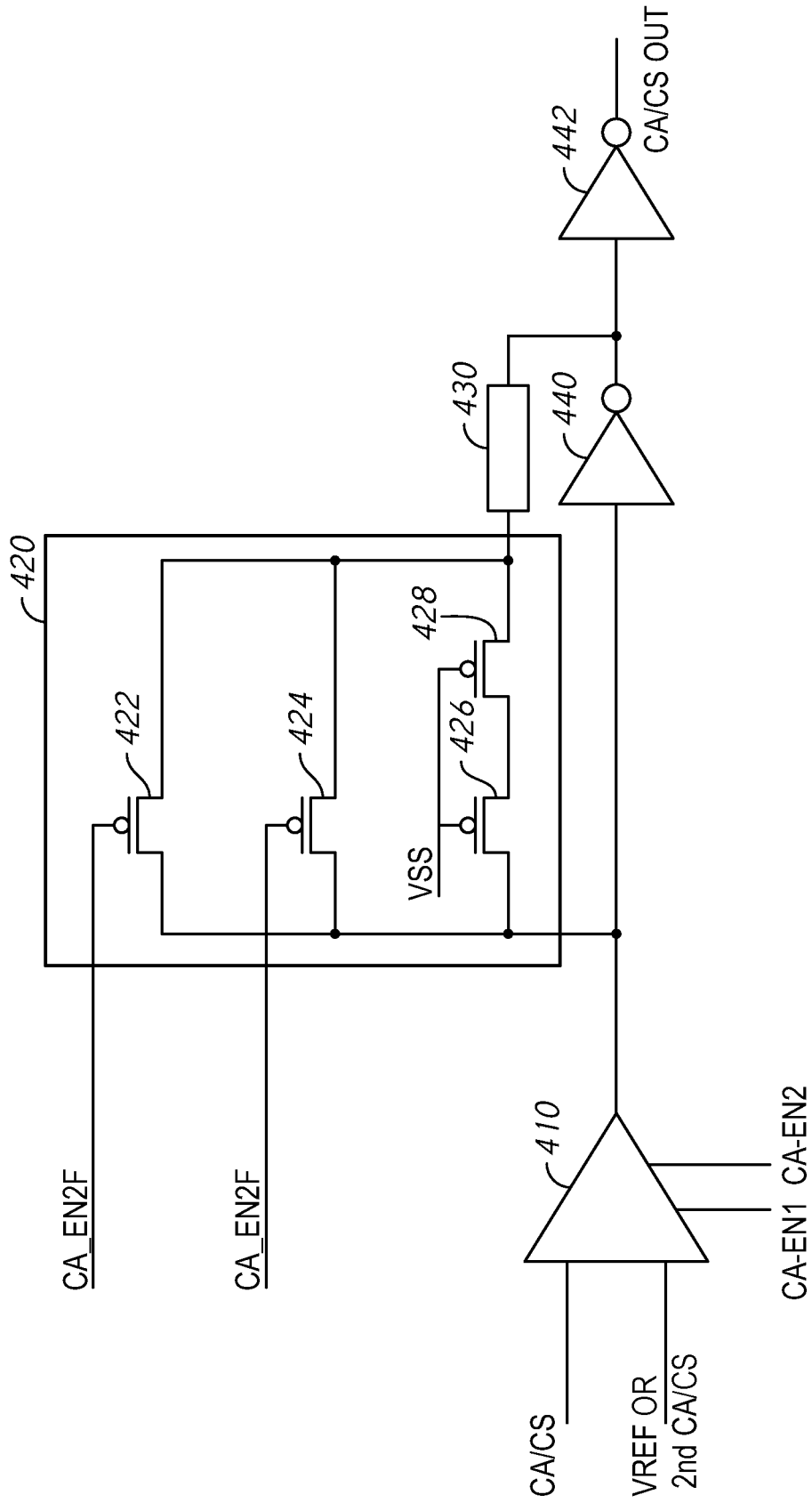
FIG. 6 is an exemplary schematic diagram of an input buffer according to an embodiment of the disclosure.

FIGS. 5 and 6 include exemplary schematic diagrams of alternate embodiments of the input buffer control circuit 300 of FIG. 3 and the input buffer 400 of FIG. 4, respectively. FIG. 5 is an exemplary schematic diagram of an input buffer control circuit 500 according to an embodiment of the disclosure. The input buffer control circuit 107 of FIG. 1 and/or the input buffer control circuit 210 of FIG. 2 may implement the input buffer control circuit 500, in some embodiments. The input buffer control circuit 500 may include elements that have been previously described with respect to the input buffer control circuit 300 of FIG. 3. Those elements have been identified in FIG. 5 using the same reference numbers used in FIG. 3 and operation of the common elements is as previously described. Consequently, a detailed description of the operation of these particular elements will not be repeated in the interest of brevity.

The input buffer control circuit 500 may be configured to receive the MR<2:0> settings, the CKE, and the SECLK signal and may include several logic gates that collectively control the CA-EN1 and the CA_EN2 signals. Different than the input buffer control circuit 300 of FIG. 3, the input buffer control circuit 500 of FIG. 5 does not include logic to control the CADEWEAKEN0/1 signals. The input buffer control circuit 500 of FIG. 5 may provide the CA-EN1 and CA-EN2 signals to the input buffer 600 of FIG. 6.

FIG. 6 is an exemplary schematic diagram of an input buffer 600 according to an embodiment of the disclosure. Any one of the input buffers 106 of FIG. 1 and/or the input buffer 220 of FIG. 2 may implement the input buffer 600, in some embodiments. The input buffer 600 may include elements that have been previously described with respect to the input buffer 400 of FIG. 4. Those elements have been identified in FIG. 6 using the same reference numbers used in FIG. 4 and operation of the common elements is as previously described. Consequently, a detailed description of the operation of these particular elements will not be repeated in the interest of brevity.

The input buffer 600 may include the amplifier 410, the de-emphasis circuit 420 coupled in series with the resistor 430, the inverter 440, and the inverter 442, as was the case in the input buffer 400 of FIG. 4. However, rather than being controlled via the CADEWEAKEN0/1 signals, the transistor 422 and the transistor 424 may both be controlled via an inverted version of the CA-EN2 signal, respectively. Otherwise, operation of the input buffer 400 may be the same as was described with reference to the input buffer 400 of FIG. 4. The embodiments described with reference to FIGS. 5 and 6 may offer a simpler implementation, albeit with fewer configuration options as compared with the embodiments of FIGS. 3 and 4, respectively.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus comprising:
   an input buffer control circuit configured to receive latency settings, a first clock enable signal and a second clock enable signal, wherein the input buffer control circuit includes a plurality of logic gates configured to collectively control a first buffer enable signal, a second buffer enable signal, a first buffer weaken signal, and a second buffer weaken signal based on the latency settings, the first clock enable signal and the second clock enable signal; and
   an input buffer configured to receive the first buffer enable signal, the second buffer enable signal, the first buffer weaken signal, and the second buffer weaken signal from the input buffer control circuit, additional signals, and a reference voltage, wherein the input buffer is further configured to provide an amplified output signal.

2. The apparatus of claim 1, wherein the input buffer control circuit further comprises:
   a first logic gate configured to receive the latency settings and provide a first output signal;
   a first inverter configured to receive the first clock enable signal and provide a second output signal;
   a second inverter configured to receive the second clock enable signal and provide a third output signal;
   a first circuit configured to receive the first, second, and third output signals and generate the second buffer enable signal, wherein the first output signal and the second output signal are at a first level.

3. The apparatus of claim 2, wherein the first circuit comprises a third inverter coupled to a fourth inverter, wherein the third inverter is configured to receive the third output signal and the fourth inverter is configured to provide the second buffer enable signal.

4. The apparatus of claim 3, wherein the fourth inverter is configured to provide the second buffer enable signal to a second circuit, wherein the second circuit is configured to provide the first buffer weaken signal.

5. The apparatus of claim 4, further comprising:
a third circuit configured to receive the latency settings and the first clock enable signal to produce the second buffer weaken signal, wherein the second buffer weaken signal is provided to the second circuit to produce the first buffer weaken signal.

6. The apparatus of claim 2, wherein the input buffer control circuit further comprises a fifth inverter configured to receive the third output from the second inverter and provide the first buffer enable signal.

7. The apparatus of claim 1, wherein the input buffer comprises an amplifier, a de-emphasis circuit coupled in series with a resistor, and a plurality of inverters.

8. The apparatus of claim 7, wherein the de-emphasis circuit is configured to selectively adjust a gain of the input buffer based on the latency settings.

9. A method comprising:
receiving latency settings, a first clock enable signal and a second clock enable signal;
collectively controlling a first buffer enable signal, a second buffer enable signal, a first buffer weaken signal, and a second buffer weaken signal, by an input buffer control circuit, based on the latency settings, the first clock enable signal, and the second clock enable signal,
providing a first output signal based on the latency signals;
providing a second output signal based on the first clock enable signal;
providing a third output signal based on the second clock enable signal;
generating the first buffer enable signal based on the third output signal; and
generating the second buffer enable signal based on the first output signal, the second output signal, and the third output signal, wherein the first output signal and the second output signal are at a first level.

10. The method of claim 9, further comprising:
generating the second buffer weaken signal based on the latency settings;
generating the first buffer weaken signal based on the second buffer weaken signal and the second buffer enable signal.

11. A method comprising:
receiving latency settings, a first clock enable signal and a second clock enable signal;
collectively controlling a first buffer enable signal, a second buffer enable signal, a first buffer weaken signal, and a second buffer weaken signal, by an input buffer control circuit, based on the latency settings, the first clock enable signal, and the second clock enable signal; and
providing an amplified output signal based on the first buffer enable signal, the second buffer enable signal, the first buffer weaken signal, and the second buffer weaken signal, additional signals, and a reference voltage.

12. The method of claim 11, further comprising:
selectively adjusting a gain of the amplified output signal based on the latency settings.

13. The method of claim 11, wherein providing the amplified output signal further comprises:
controlling power of an amplifier with the first buffer enable signal and the second buffer enable signal;
selectively enabling a plurality of transistors in a de-emphasis circuit with the first buffer weaken signal and the second buffer weaken signal, wherein the plurality of transistors is coupled in parallel to a resistance.

* * * * *